United States Patent
Nikonov et al.

(10) Patent No.: US 8,198,692 B2
(45) Date of Patent: *Jun. 12, 2012

(54) SPIN TORQUE MAGNETIC INTEGRATED CIRCUITS AND DEVICES THEREFOR

(75) Inventors: Dmitri E. Nikonov, Morgan Hill, CA (US); George I. Bourianoff, Austin, TX (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/279,112

(22) Filed: Oct. 21, 2011

(65) Prior Publication Data

US 2012/0038387 A1 Feb. 16, 2012

Related U.S. Application Data

(63) Continuation of application No. 12/642,342, filed on Dec. 18, 2009, now Pat. No. 8,063,460.

(51) Int. Cl.
*H01L 29/82* (2006.01)
*G11C 11/00* (2006.01)

(52) U.S. Cl. .......................... 257/421; 365/66

(58) Field of Classification Search .................. 365/63, 365/66, 100, 158; 257/421–425, E29.323
See application file for complete search history.

(56) References Cited

U.S. PATENT DOCUMENTS

| | | | |
|---|---|---|---|
| 7,098,495 B2 * | 8/2006 | Sun et al. ................. | 257/295 |
| 7,233,039 B2 | 6/2007 | Huai et al. | |
| 7,474,514 B2 | 1/2009 | Nishioka et al. | |
| 7,572,645 B2 | 8/2009 | Sun et al. | |
| 7,772,659 B2 | 8/2010 | Rodmacq et al. | |
| 8,063,460 B2 * | 11/2011 | Nikonov et al. ............ | 257/421 |
| 2005/0040438 A1 | 2/2005 | Dobisz et al. | |
| 2008/0074799 A1 | 3/2008 | Ishiwata | |
| 2008/0225583 A1 | 9/2008 | Guo et al. | |

OTHER PUBLICATIONS

Braganca, Patrick M., et al. "A Three-Terminal Approach to Developing Spin-Torque Written Magnetic Random Access Memory Cells," IEEE Transactions on Nanotechnology, vol. 8, No. 2, Mar. 2009, 6 pgs.

International Search Report and Written Opinion from PCT/US2010/056735 mailed Jul. 28, 2011, 9 pgs.

Hosomi, M , et al., "A Novel Nonvolatile Memory with Spin Torque Transfer Magnetization Switching: Spin-RAM", IEEE 2005, 4 Pages.

Kishi, T , et al., "Lower-current and Fast switching of A Perpendicular TMR for High Speed and High density Spin-Transfer-Torque MRAM", IEEE Xplore, Jun. 11, 2009, 4 Pages.

Mangin, S , et al., "Current-induced magnetization reversal in nanopillars with perpendicular anisotropy", Nature Materials, vol. 5, Mar. 2006, 6 Pages.

Matsunaga, Shoun , et al., "Fabrication of a Nonvolatile Full Adder Based on Logic-in-Memory Architecture Using Magnetic Tunnel Junctions", Applied Physics Express 1 (2008), 3 Pages.

(Continued)

*Primary Examiner* — Calvin Lee
(74) *Attorney, Agent, or Firm* — Blakely, Sokoloff, Taylor & Zafman LLP

(57) ABSTRACT

Spin torque magnetic integrated circuits and devices therefor are described. In an example, a spin torque magnetic device for a logic circuit includes a majority gate structure. An output is coupled to the majority gate structure. Three inputs are also coupled to the majority gate structure.

9 Claims, 5 Drawing Sheets

OTHER PUBLICATIONS

Yoshikawa, Masatoshi, et al., "Tunnel Magnetoresistance Over 100% in MgO-Based Magnetic Tunnel Junction Films With Perpendicular Magnetic L10-FePt Electrodes", IEEE Transactions on Magnetics, vol. 44, No. 11, Nov. 2008, 4 Pages.

Yuasa, Shinji, et al., "Giant room-temperature magnetoresistance in single-crystal Fe/MgO/Fe magnetic tunnel junctions", Nature Materials, vol. 3, Dec. 2004, 4 Pages.

* cited by examiner

SPIN TORQUE MAGNETIC INTEGRATED CIRCUITS AND DEVICES THEREFOR

CROSS-REFERENCE TO RELATED APPLICATIONS

This application is a continuation of U.S. patent application Ser. No. 12/642,342, filed Dec. 18, 2009, and now U.S. Pat. No. 8,063,460 issued Nov. 22, 2011, the entire contents of which are hereby incorporated by reference herein.

TECHNICAL FIELD

Embodiments of the invention are in the field of reconfigurable and non-volatile logic circuits and, in particular, spin torque magnetic integrated circuits and devices therefor.

BACKGROUND

The operation of spin torque devices is based on the phenomenon of spin transfer torque. If a current is passed through a magnetization layer, called the fixed layer, it will come out spin polarized. With the passing of each electron, its spin (which is angular momentum of the electron) will be added to the magnetization in a next magnetic layer, called the free layer, and will cause a small change in the free layer. This is, in effect, a torque-causing precession of magnetization in the free layer. Due to reflection of electrons, a torque is also exerted on the magnetization of an associated fixed layer. In the end, if the current exceeds a certain critical value (given by damping caused by the magnetic material and its environment), the magnetization of the free layer will be switched by a pulse of current, typically in about 1 nanosecond. Magnetization of the fixed layer may remain unchanged since an associated current is below its critical value due to geometry or due to and adjacent antiferromagnetic layer.

DETAILED DESCRIPTION

Figure 1:
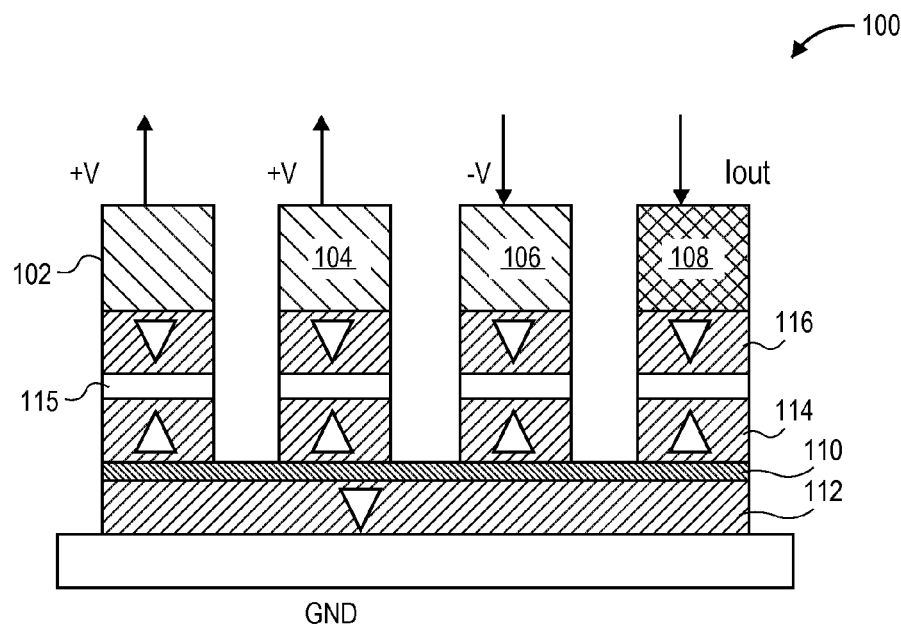
FIG. 1 illustrates a cross-sectional view of a spin torque magnetic device, in accordance with an embodiment of the present invention.

Spin torque magnetic integrated circuits and devices therefor are described. In the following description, numerous specific details are set forth, such as material regimes and device characteristics, in order to provide a thorough understanding of embodiments of the present invention. It will be apparent to one skilled in the art that embodiments of the present invention may be practiced without these specific details. In other instances, well-known features, such as patterning processes, are not described in detail in order to not unnecessarily obscure embodiments of the present invention. Furthermore, it is to be understood that the various embodiments shown in the Figures are illustrative representations and are not necessarily drawn to scale.

Disclosed herein are spin torque magnetic integrated circuits. In one embodiment, a spin torque magnetic integrated circuit includes a first free ferromagnetic layer disposed above a substrate. A coupling layer is disposed on the first free ferromagnetic layer and a second free ferromagnetic layer is disposed on the coupling layer. A tunnel oxide layer is disposed above the second free ferromagnetic layer. A write pillar and a read pillar are included, each pillar disposed above the tunnel oxide layer and including an anti-ferromagnetic layer disposed above a fixed ferromagnetic layer. In one embodiment, the coupling layer is for stabilizing an alignment of magnetization in the first and second free ferromagnetic layers. In one embodiment, a spin torque magnetic integrated circuit includes a first free ferromagnetic layer disposed on a portion of a substrate, the first free ferromagnetic layer having a sidewall. A first coupling layer is disposed on the first free ferromagnetic layer, the first coupling layer conformal with the sidewall and adjacent to an exposed portion of the substrate. A second free ferromagnetic layer is disposed on the first coupling layer and on the exposed portion of the substrate, the second free ferromagnetic coupling layer conformal with the first coupling layer. A second coupling layer is disposed on the second free ferromagnetic layer, the upper-most surface of the second coupling layer approximately planar with the upper-most surface of the second free ferromagnetic layer. A third free ferromagnetic layer is disposed on the portion of the second coupling layer above the exposed portion of the substrate, the upper-most surface of the third free ferromagnetic layer approximately planar with the upper-most surface of the second coupling layer. A tunnel oxide layer is disposed on the upper-most surfaces of the second coupling layer and the second and third free ferromagnetic layers. A write pillar and a read pillar are included, each pillar disposed above the tunnel oxide layer and including an anti-ferromagnetic layer disposed above a fixed ferromagnetic layer.

Also disclosed herein are methods of fabricating a spin torque magnetic integrated circuits. In one embodiment, a method includes forming a first free ferromagnetic layer on a portion of a substrate, the first free ferromagnetic layer having a sidewall. A first coupling layer is formed on the first free ferromagnetic layer, the first coupling layer conformal with the sidewall and adjacent to an exposed portion of the substrate. A second free ferromagnetic layer is formed on the first coupling layer and on the exposed portion of the substrate, the second free ferromagnetic coupling layer conformal with the first coupling layer. A second coupling layer is formed on the second free ferromagnetic layer, the upper-most surface of the second coupling layer approximately planar with the upper-most surface of the second free ferromagnetic layer. A third free ferromagnetic layer is formed on the portion of the second coupling layer above the exposed portion of the substrate, the upper-most surface of the third free ferromagnetic layer approximately planar with the upper-most surface of the second coupling layer. A tunnel oxide layer is formed on the upper-most surfaces of the second coupling layer and the second and third free ferromagnetic layers. A write pillar and a read pillar are formed, each pillar formed above the tunnel oxide layer and including an anti-ferromagnetic layer formed above a fixed ferromagnetic layer.

In accordance with an embodiment of the present invention, magnetic logic devices are fabricated in which a computational variable is stored in the direction of magnetization. In an embodiment, such logic devices are connected by a common magnetic layer and integrated to form logic gates or circuits. Logic functionality may be defined by the shape of a circuit associated with the logic arrangement. For example, in an embodiment, a signal is transferred between devices by a domain wall transport (separating areas of opposing magnetization). However, magnetic electrical conversion may be needed only at the periphery of the circuit, and not at every magnetic device. In an embodiment, the logic arrangements described herein serve as application specific logic blocks embedded in the metal layers of a complimentary metal-oxide-semiconductor (CMOS) circuit. In an embodiment, non-volatile, reconfigurable logic is provided. Thus, non-volatile and reconfigurable logic blocks may be created. In an embodiment, spin torque devices, e.g. majority gate devices, are used to fabricate reconfigurable and non-volatile logic circuits and, in particular, spin torque magnetic integrated circuits. In one embodiment, a single magnetic circuit is used for multiple gates. This mitigates or eliminates the need for an electrical to magnetic (or vice versa) conversion at each gate and instead can be performed at a periphery alone.

In certain aspects and at least some embodiments of the present invention, certain terms hold certain definable meanings. For example, a "free" magnetic layer is a magnetic layer storing a computational variable. A "fixed" magnetic layer is a magnetic layer with permanent magnetization. A tunneling barrier, such as a tunneling dielectric or tunneling oxide, is one located between free and fixed magnetic layers. A fixed layer may be patterned to create inputs and outputs to an associated circuit. A free layer may be common, connecting all logic devices and gates in a particular circuit. Magnetization may be written by spin transfer torque effect while passing a current through the input electrodes. Magnetization may be read via the tunneling magnetoresistance effect while applying voltage to the output electrodes.

In an embodiment, the role of the tunnel oxide is to cause a large magnetoresistance. The magnetoresistance is the ratio of the difference between resistances when the two ferromagnetic layers have anti-parallel and parallel magnetization and the resistance of the state with the parallel magnetization. In an embodiment, an alternative to the tunneling barrier is a thin layer of non-magnetic metal. However, one potential drawback of this alternative approach is the possibility of a lower value of magnetization. In this application, these two options are referred to collectively as a "non-magnetic layer."

In conventional approaches, reconfigurability may be achieved by using a field-programmable gate array (FPGA). Typically, nodes of FPGA are reconfigured by writing static random access memory (SRAM) cells attached to each node. Thus, the circuits occupy a large area, are volatile, and require significant energy for reconfiguration and maintaining configuration. Also, this approach often requires Application Specific Integrated Circuits (ASICs). Presently, non-volatile logic is not in mass production. Ferroelectric transistors are a potential option, but suitable devices have not been demonstrated. In an embodiment, however, the use of such non-volatile devices offers much more compact reconfigurable circuits than CMOS-based FPGA. Logic circuits based on ferromagnet logic may have zero stand-by power, since power can be switched off in an idle regime. Furthermore, there may be no need for special memory elements in each node to store the circuit configuration. Data may be stored in the vicinity of the logic circuits. In an embodiment, the use of ferromagnet logic drastically improves computation speed by elimination of latency associated with cache misses.

In accordance with embodiments of the present invention, ferromagnetic layers are used to store a computational variable, spin transfer torque is used to switch magnetization, majority gates are used for performing logic, and a common magnetic layer or layers are used as the connecting medium to connect devices to form gates and circuits. The logic circuits may not lose their computational state when power to an associated chip is cycled off. Gates may be reconfigured by changing one of their inputs. Spin transfer torque may cause switching of magnetization not only in an adjacent gate, but in all subsequent cascaded devices and gates. This approach may be accomplished by propagating ferromagnetic domains separated by a domain wall through the free magnetic layer.

Figure 2:
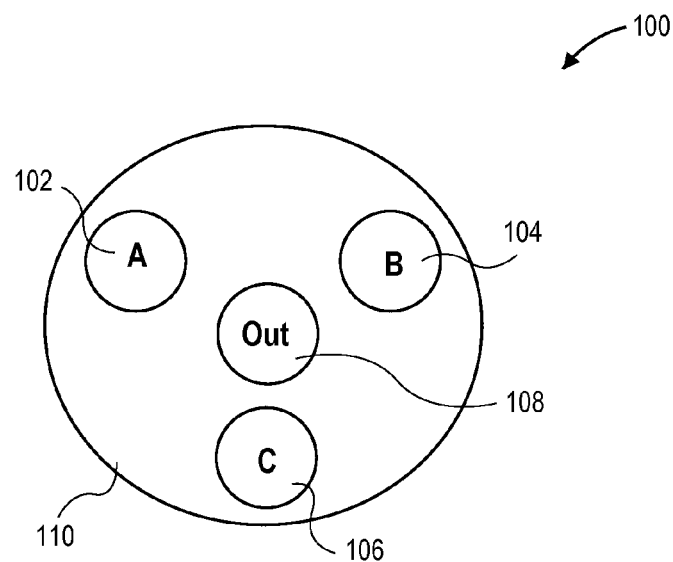
FIG. 2 illustrates a top-down view of a spin torque magnetic device, in accordance with an embodiment of the present invention.

In an aspect of the present invention, integrated ferromagnetic logic circuits include standalone ferromagnetic logic elements. FIG. 1 illustrates a cross-sectional view of a spin torque magnetic device, in accordance with an embodiment of the present invention. FIG. 2 illustrates a top-down view of a spin torque magnetic device, in accordance with an embodiment of the present invention.

Referring to FIGS. 1 and 2, a spin torque majority gate 100 includes three electrical inputs 102, 104, and 106, and one electrical output 108. In an embodiment, electrical inputs 102, 104, 106 and 108 are formed as nanopillars over a tunneling barrier 110, as depicted in FIGS. 1 and 2. Magnetic layers 112, 114, and 116 are included and, in an embodiment, are composed of materials with out-of-plane anisotropy, e.g. TbCoFe, or CoPt multi-layers.

Operationally, current passes through each of the inputs 102, 104 and 106 and aligns, via the effect of spin transfer torque, the magnetization of a free layer (magnetic layer 112) to point in one of the two low-energy directions, up or down, depending on the direction of the current. The majority of the inputs 102, 104 and 106 dominates and enforces their direction of magnetization over the majority of the area of free ferromagnetic layer 112 and the area under read pillar 108. In an embodiment, this arrangement is referred to as a majority gate device. The direction of magnetization may be detected via the effect of tunneling magnetoresistance by applying voltage and measuring current through the output electrode 108. Fixed ferromagnetic layers 114 and 116 in the electrodes 102, 104, 106 and 108 are double layers with opposite magnetization which are exchange-coupled between one another. In an embodiment, a coupling layer 115 is included and, in one embodiment, coupling layer 115 is a layer of ruthenium metal having a thickness of less than approximately 1 nanometer. Referring to FIG. 1, the single common free ferromagnetic layer 112 spans over the four electrodes. Referring to FIG. 2, the electrodes are positioned on top of the common free layer. In order to use the output signal, it needs to be read, e.g. converted from the magnetization to electrical form. In an embodiment, this conversion can be performed by using a conventional sense amplifier.

In another aspect of the present invention, magnetic circuits are fabricated to not be limited to only three inputs and one output. Instead, in accordance with an embodiment of the present invention, a magnetic-to-electric conversion does not occur at each majority gate, but rather at the periphery of a magnetic circuit. Electrodes are placed in a few positions in the circuit. The signal is passed between gates in the form of change of magnetization, by moving a ferromagnetic domain wall, which separates regions with opposite directions of magnetization. The geometrical shape of the magnetic circuit determines its logic functionality. For this approach, the shape of a majority gate needs to be changed, e.g. to a cross, as will be discussed below in association with FIG. 6. In this way, the inputs and outputs are positioned at the edges of a single majority gate, and several majority gates can be cascaded, while the magnetization signal at the output can be passed to the input of the next cascaded gate. In an embodiment, one majority gate performs the role of a reconfigurable AND/OR gate. Notably, it would otherwise be required that 12 usual CMOS transistors be used to implement this functionality in a conventional CMOS implementation. In an embodiment, three concatenated majority gates are used to perform the role of a 1 bit stage of a full carry adder, as described in association with FIG. 7 below, whereas a conventional CMOS implementation requires 28 transistors.

Figure 3:
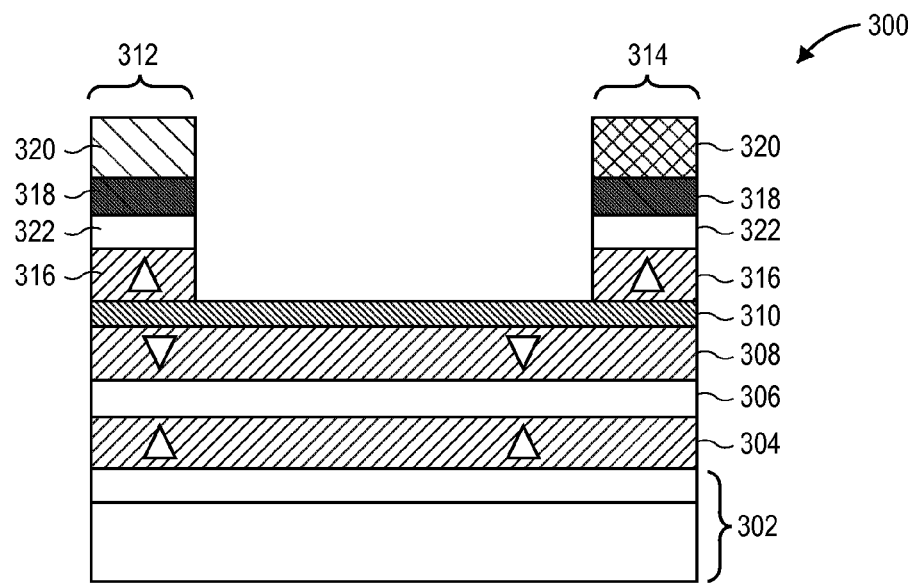
FIG. 3 illustrates a cross-sectional view of a portion of a spin torque magnetic integrated circuit, in accordance with an embodiment of the present invention.

In an aspect of the present invention, a free ferromagnetic layer is composed of two layers ferromagnetic material separated by a layer of ruthenium. The ruthenium layer may be used to enforce quantum exchange coupling between layers resulting in their opposite magnetizations. For example, FIG. 3 illustrates a cross-sectional view of a portion of a spin torque magnetic integrated circuit, in accordance with an embodiment of the present invention. FIG. 3 shows two out of multiple electrodes used in an integrated circuit.

Referring to FIG. 3, a portion of a spin torque magnetic integrated circuit 300 includes a first free ferromagnetic layer 304 disposed above a substrate 302. A coupling layer 306 is disposed on the first free ferromagnetic layer 304. A second free ferromagnetic layer 308 is disposed on coupling layer 306. A tunnel oxide layer 310 is disposed above the second free ferromagnetic layer 308. A write pillar 312 and a read pillar 314 are included, each pillar disposed above tunnel oxide layer 310 and including an anti-ferromagnetic layer 318 disposed above a fixed ferromagnetic layer 316.

In accordance with an embodiment of the present invention, coupling layer 306 is for stabilizing an alignment of magnetizations in the first and second free ferromagnetic layers 304 and 308, respectively. In one embodiment, coupling layer 306 is composed of ruthenium (Ru) and the first and second free ferromagnetic layers 304 and 308 are composed of terbium colbalt iron (TbCoFe). In a specific embodiment, tunnel oxide layer 310 is disposed directly on the second free ferromagnetic layer 310 and is composed of magnesium oxide (MgO) or aluminum oxide ($Al_2O_3$), and each of the write pillar 312 and the read pillar 314 includes a copper layer 320 disposed on anti-ferromagnetic layer 318, and includes an intervening layer 322 disposed directly between anti-ferromagnetic layer 318 and fixed ferromagnetic layer 316, fixed ferromagnetic layer 316 disposed directly on tunnel oxide layer 310. In one embodiment, coupling layer 306 has a thickness of less than approximately 1 nanometer. In a specific embodiment, coupling layer 306 is a layer of ruthenium metal having a thickness of less than approximately 1 nanometer to ensure an optimal coupling between the ferromagnetic layers 304 and 308.

Figure 4:
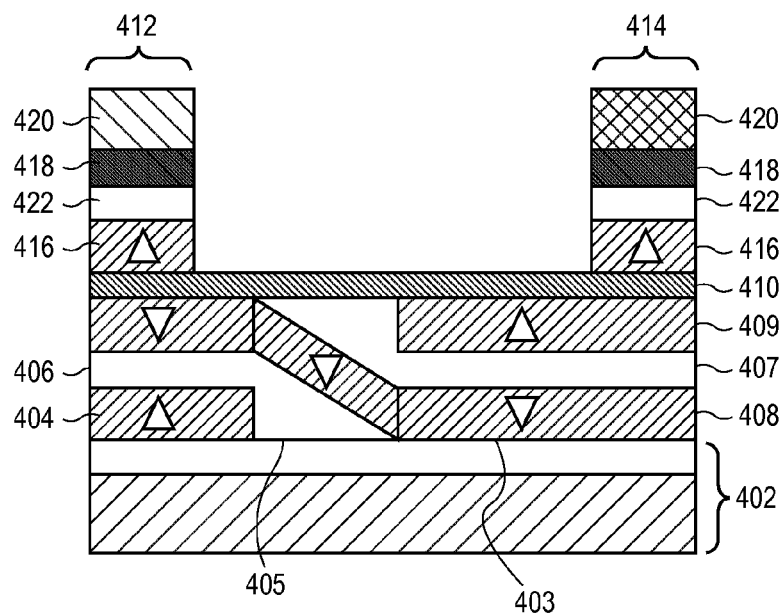
FIG. 4 illustrates a cross-sectional view of a portion of a spin torque magnetic integrated circuit, in accordance with an embodiment of the present invention.

In an aspect of the present invention, a built-in inverter may be included in a logic circuit based on magnetic devices. The built-in inverter may include a tilted connecting layer between upper and lower layers in a free ferromagnetic layer. FIG. 4 illustrates a cross-sectional view of a portion of a spin torque magnetic integrated circuit, in accordance with an embodiment of the present invention.

Referring to FIG. 4, a portion of a spin torque magnetic integrated circuit 400 includes a first free ferromagnetic layer 404 disposed on a portion of a substrate 402, the first free ferromagnetic layer 404 having a sidewall 405. A first coupling layer 406 is disposed on the first free ferromagnetic layer 404, the first coupling layer 406 conformal with the sidewall 405 and adjacent to an exposed portion 403 of substrate 402. A second free ferromagnetic layer 408 is disposed on the first coupling layer 406 and on the exposed portion 403 of substrate 402, the second free ferromagnetic coupling layer 408 conformal with the first coupling layer 404. A second coupling layer 407 is disposed on the second free ferromagnetic layer 408, the upper-most surface of the second coupling layer 407 approximately planar with the upper-most surface of the second free ferromagnetic layer 408. A third free ferromagnetic layer 409 is disposed on the portion of the second coupling layer 407 above the exposed portion 403 of substrate 402, the upper-most surface of the third free ferromagnetic layer 409 approximately planar with the upper-most surface of the second coupling layer 407. A tunnel oxide layer 410 is disposed on the upper-most surfaces of the second coupling layer 407 and the second and third free ferromagnetic layers 408 and 409, respectively. A write pillar 412 and a read pillar 414 are included, each pillar disposed above tunnel oxide layer 410 and including an anti-ferromagnetic layer 418 disposed above a fixed ferromagnetic layer 416.

In accordance with an embodiment of the present invention, the first, second and third free ferromagnetic layers 404, 408 and 409 form an inverter. In an embodiment, the first coupling layer 406 is for stabilizing an alignment of magnetization in the first and second free ferromagnetic layers 404 and 408. In one embodiment, the first coupling layer 406 is composed of ruthenium (Ru), and the first and second free ferromagnetic layers 404 and 408 are composed of terbium colbalt iron (TbCoFe). In a specific embodiment, tunnel oxide layer 410 is disposed directly on the upper-most surfaces of the second coupling layer 407 and the second and third free ferromagnetic layers 408 and 409 and is composed of magnesium oxide (MgO) or aluminum oxide ($Al_2O_3$), and each of the write pillar 412 and the read pillar 414 includes a copper layer 420 disposed on anti-ferromagnetic layer 418, and includes an intervening layer 422 disposed directly between anti-ferromagnetic layer 418 and fixed ferromagnetic layer 416, fixed ferromagnetic layer 416 disposed directly on tunnel oxide layer 410.

In an embodiment, the second coupling layer 407 is for stabilizing an alignment of magnetization in the second and third free ferromagnetic layers 408 and 409. In one embodiment, the second coupling layer 407 is composed of ruthenium (Ru) and the second and third free ferromagnetic layers 408 and 409 are composed of terbium colbalt iron (TbCoFe). In an embodiment, substrate 402 is composed of a top dielectric layer disposed on a metal layer. In an embodiment, the portion of the first coupling layer 406 between the first and second free ferromagnetic layers 404 and 408 has a thickness of less than approximately 1 nanometer, and the portion of the second coupling layer 407 between the second and third free ferromagnetic layers 408 and 409 has a thickness of less than approximately 1 nanometer.

With respect to operating the portions of the circuits of FIGS. 3 and 4, in accordance with an embodiment of the present invention, a fixed layer is further fixed by placing it next to an anti-ferromagnetic layer (e.g., IrMn or PtMn). In this way, the spins in the ferromagnetic and anti-ferromagnetic layers are strongly coupled, and change of magnetization in the fixed layer is prevented (e.g., the layer is "pinned"). The free layer may be formed as a "synthetic ferrimagnet" out of two ferromagnetic layers and a layer of ruthenium between them. The latter may cause anti-parallel alignment of magnetizations between the two constituent ferromagnetic layers. In an embodiment, this property is exploited to implement the inverter logic function in a wire. For such a structure as the structure described in association with FIG. 4, a middle ferromagnetic layer is included which serves as the top layer before the inverter and as a bottom layer after the inverter. The continuity of the middle ferromagnetic layer may ensure that the magnetization therein all has the same direction. As such, the magnetization of the layer adjacent to the tunneling oxide may become opposite before and after the inverter. In an embodiment, it is this direction of magnetization that is measured by tunneling magnetoresistance and holds a computational variable.

Figure 5:
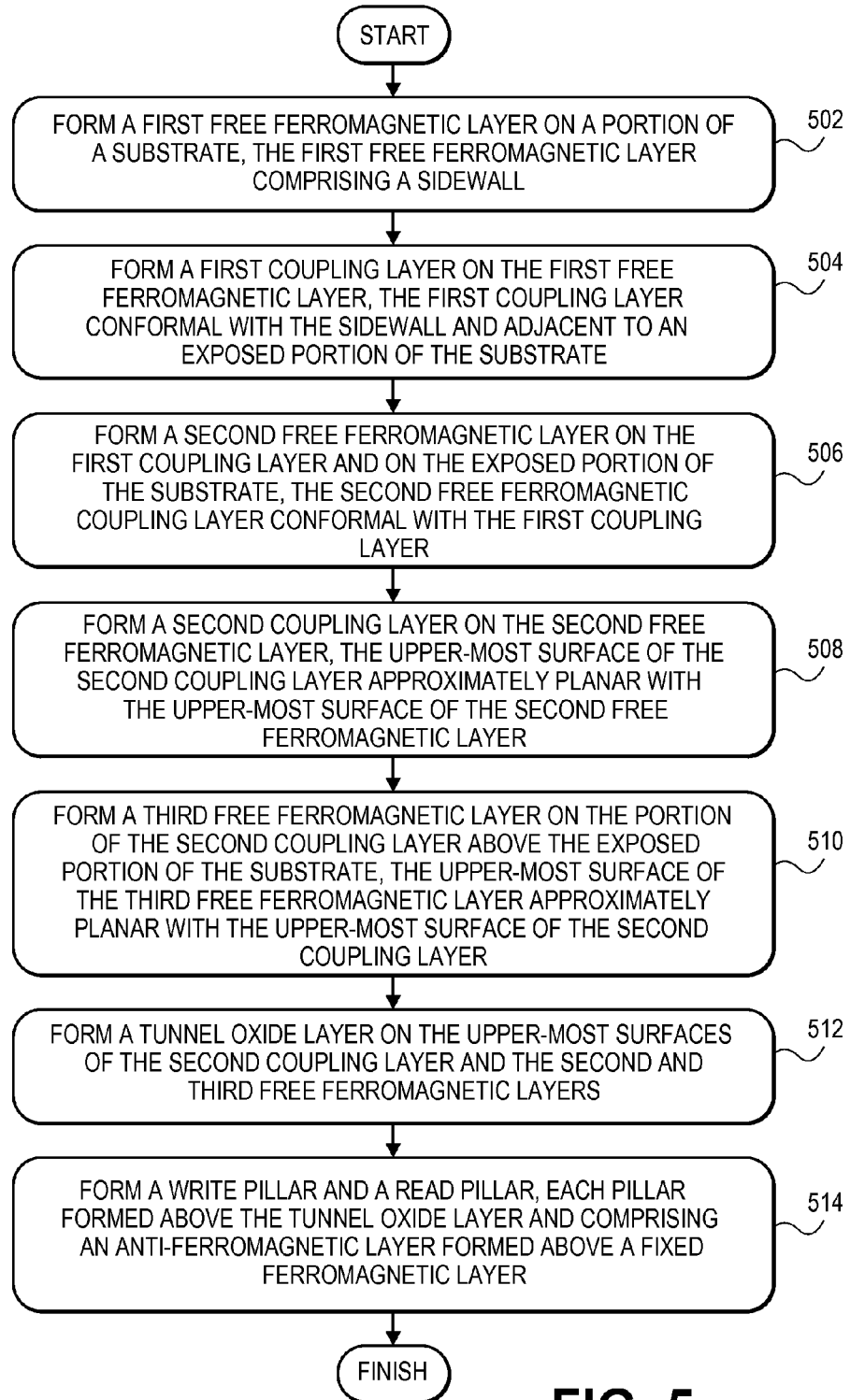
FIG. 5 illustrates a Flowchart representing operations in the fabrication of a portion of a spin torque magnetic integrated circuit, in accordance with an embodiment of the present invention.

In an aspect of the present invention, a method to fabricate an inverter structure includes some or all of the following operations: (1) a bottom ferromagnetic layer is deposited, (2) the bottom ferromagnetic layer is etched to be cut at all places in wires where inverters are needed, (3) a first ruthenium layer is deposited to conformally cover the steps in the bottom ferromagnetic layer, (4) a middle ferromagnetic layer is deposited to conform to the slope at the step, (5) a second ruthenium layer is deposited, and (6) a top ferromagnetic layer is deposited and etched to remain on the other side of the inverter. In an embodiment, an etch stop is used on top of the second ruthenium layer to allow etching of the top ferromagnetic layer. FIG. 5 illustrates a Flowchart 500 representing operations in the fabrication of a portion of a spin torque magnetic integrated circuit, in accordance with an embodiment of the present invention.

Referring to operation 502 of Flowchart 500, a method of fabricating a spin torque magnetic integrated circuit includes forming a first free ferromagnetic layer on a portion of a substrate, the first free ferromagnetic layer having a sidewall. In accordance with an embodiment of the present invention, forming the first free ferromagnetic layer on the portion of the substrate includes forming the first free ferromagnetic layer on a dielectric layer disposed on a metal layer.

Referring to operation 504 of Flowchart 500, a method of fabricating a spin torque magnetic integrated circuit also includes forming a first coupling layer on the first free ferromagnetic layer, the first coupling layer conformal with the sidewall and adjacent to an exposed portion of the substrate.

Referring to operation 506 of Flowchart 500, a method of fabricating a spin torque magnetic integrated circuit also includes forming a second free ferromagnetic layer on the first coupling layer and on the exposed portion of the substrate, the second free ferromagnetic coupling layer conformal with the first coupling layer.

Referring to operation 508 of Flowchart 500, a method of fabricating a spin torque magnetic integrated circuit also includes forming a second coupling layer on the second free ferromagnetic layer, the upper-most surface of the second coupling layer approximately planar with the upper-most surface of the second free ferromagnetic layer.

Referring to operation 510 of Flowchart 500, a method of fabricating a spin torque magnetic integrated circuit also includes forming a third free ferromagnetic layer on the portion of the second coupling layer above the exposed portion of the substrate, the upper-most surface of the third free ferromagnetic layer approximately planar with the upper-most surface of the second coupling layer. In accordance with an embodiment of the present invention, forming the first, second and third free ferromagnetic layers forms an inverter. In an embodiment, the portion of the first coupling layer between the first and second free ferromagnetic layers has a thickness of less than approximately 1 nanometer, and the portion of the second coupling layer between the second and third free ferromagnetic layers has a thickness of less than approximately 1 nanometer.

Referring to operation 512 of Flowchart 500, a method of fabricating a spin torque magnetic integrated circuit also includes forming a tunnel oxide layer on the upper-most surfaces of the second coupling layer and the second and third free ferromagnetic layers.

Referring to operation 514 of Flowchart 500, a method of fabricating a spin torque magnetic integrated circuit also includes forming a write pillar and a read pillar, each pillar formed above the tunnel oxide layer and including an anti-ferromagnetic layer formed above a fixed ferromagnetic layer. In accordance with an embodiment of the present invention, the tunnel oxide layer is formed directly on the upper-most surfaces of the second coupling layer and the second and third free ferromagnetic layers and is composed of magnesium oxide (MgO) or aluminum oxide ($Al_2O_3$). Each of the write pillar and the read pillar includes a copper layer formed on the anti-ferromagnetic layer, and includes an intervening layer formed directly between the anti-ferromagnetic layer and the fixed ferromagnetic layer, the fixed ferromagnetic layer formed directly on the tunnel oxide layer.

Figure 6:
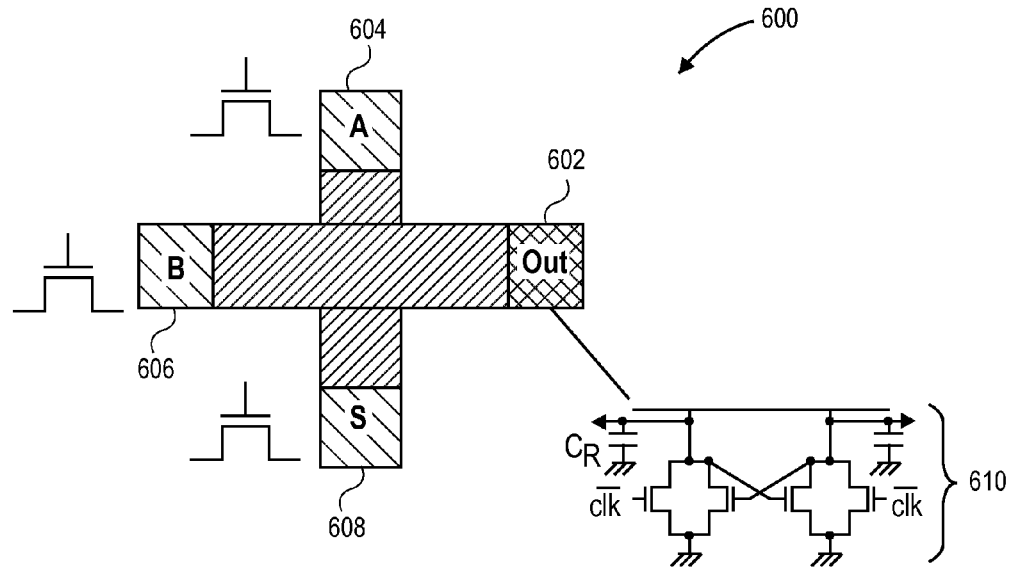
FIG. 6 illustrates a plan view of a portion of a majority gate, in accordance with an embodiment of the present invention.

In another aspect of the present invention, a majority gate is included in a logic circuit. FIG. 6 illustrates a plan view of a portion of a majority gate, in accordance with an embodiment of the present invention.

Referring to FIG. 6, a top view a majority gate 600 is in the form of a cross. An output 602 is at the edge of majority gate 600 and may be used as an input into another gate (not shown). This approach does not require conversion of magnetization to the electrical signal. In an embodiment, majority gate 600 serves as a reconfigurable AND/OR gate. Also depicted are driver transistors which pass current to inputs 604, 606 and 608, and a sense amp 610 for optional read-out of output 602.

Figure 7:
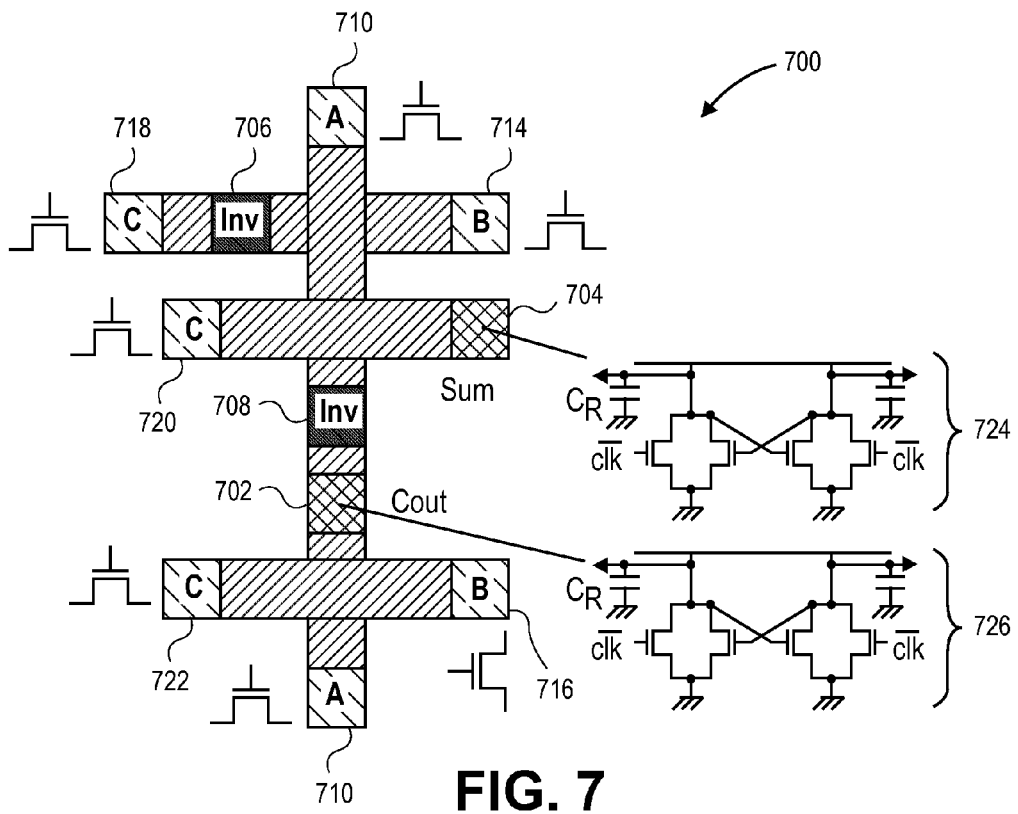
FIG. 7 illustrates a plan view of a 1 bit stage of a full carry adder, in accordance with an embodiment of the present invention.

In another aspect of the present invention, several majority gates are included in a logic circuit. FIG. 7 illustrates a plan view of a 1 bit stage of a full carry adder, in accordance with an embodiment of the present invention.

In an embodiment, single gates, such as the majority gate of FIG. 6, are cascaded into larger circuits without the need of magnetic-to-electric and electric-to-magnetic conversion. Referring to FIG. 7, a top view of a 1 bit stage of a full carry adder 700 includes magnetic outputs of the top and bottom crosses (majority gates), respectively, are fed as inputs to the middle cross (majority gate). The overall outputs are taken and converted to the electrical signal only at output pads 702 and 704. It is to be understood that many more than the three majority gates shown may be cascaded in a similar manner. Signals A (two labels 710) and B (714 and 716) carry the two bits to be summed and signal C (718, 720, 722) is the "carry in." The output sum and "carry out" for this operation appear as the polarization of electrodes 702 and 704 marked Sum and Cout, respectively. These may serve as input for additional stages. The one-bit ripple adder is formed out of 3 cascaded crosses with two inverters 706 and 708, as shown. Sense amps 726 and 724 for optional read-out of outputs 702 and 704, respectively, are also depicted.

In an embodiment, in order to achieve competitive operation specifications, a circuit is operated at low voltage (V), e.g. 0.1 Volts. This possibility may arise because ferromagnetic logic does not rely on raising and lowering a potential barrier. In both conventional cases and embodiments described herein, such a barrier exists and needs to be several times larger than the thermal energy 40 kT (where T is the temperature, and k is Boltzman's constant), or approximately 1V. However, in a conventional field effect transistor, this barrier is formed between electrons in the source and electron in the drain by a potential in the channel. This potential barrier is of the height Eb=qV and may be determined by the gate voltage. As the gate voltage switches, this barrier turns on and off. By contrast, in accordance with an embodiment of the present invention, in the case of ferromagnetic logic, the applied voltage is only needed to drive current into the electrodes. The height of the energy barrier between the logical states may be determined by the magnetic material anisotropy and is not changed with applied voltage.

Figure 8:
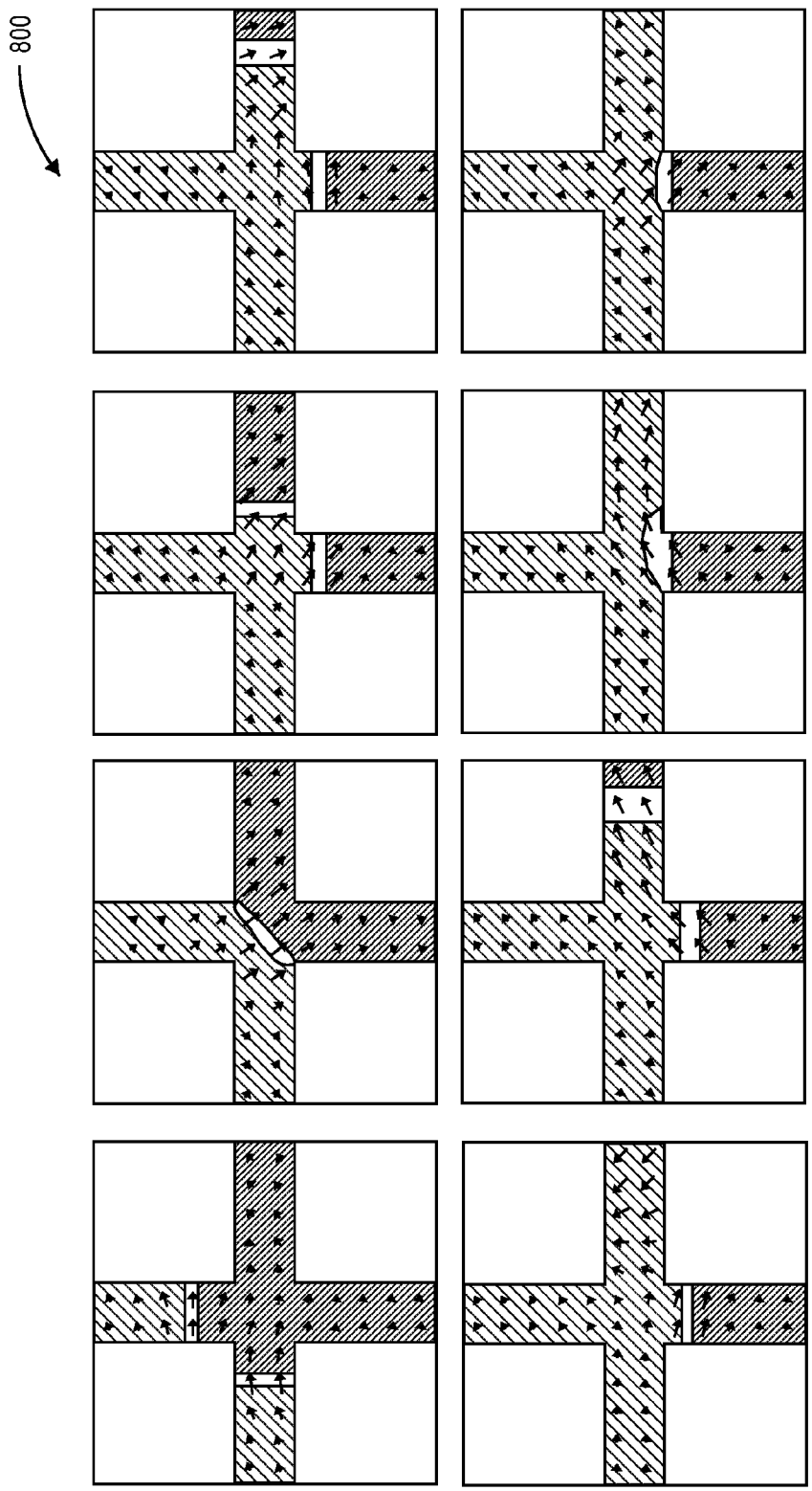
FIG. 8 illustrates a series of plots representing magnetization direction by snapshots with 0.1 nanosecond spacing, in accordance with an embodiment of the present invention.

Micro-magnetic simulations may be performed with software OOMMF to validate the operation of logic devices described in embodiments of the present invention. For example, temporal dynamics of the distribution of magnetization in the device from material parameters and applied current may be calculated. FIG. 8 illustrates a series of plots 800 representing magnetization direction by snapshots with 0.1 nanosecond spacing, in accordance with an embodiment of the present invention.

Referring to FIG. 8, following the snapshots horizontally, the absolute value of magnetization remains the same, 400 kA/m, but its direction switches. The size of the cross is approximately 120 nm, the thickness of the ferromagnetic layer is approximately 2 nanometers thick, and the current in each electrode is approximately 10 mA. In the snapshots, taken every 0.1 nanosecond, the arrows designate magnetization direction in the plane of the chip. The maps designate the projection m/z perpendicular to the chip, where the darker shading is down, and the lighter shading is up. The projections of magnetization at the output electrode are plotted. Change of resistance is proportional to the value of projection m/z. For example, a characteristic change of resistance is ~100% for a magnesium oxide (MgO) tunneling barrier. The simulation shows that, in accordance with an embodiment of the present invention, magnetization in fact switches in the output to align with the direction of magnetization in the majority of the inputs.

In accordance with embodiments of the present invention, ferromagnetic circuits are intended as a step beyond embedded magnetic memory on chip. They may open new opportunities for circuit design by providing storage of the computational variables in addition to the processing of such circuits. There may not be a need to fetch the computational data from a distant memory every time a logic operation starts. Furthermore, such circuits may not occupy any real estate on chip, since they may be placed over metal layers. In an embodiment, similar functions (e.g., reconfigurable AND/OR gate) or adder are performed with a much smaller number of elements than when implemented with CMOS transistors. Even though the speed of magnetic switching is much slower than that of a conventional transistor, a careful account of the clock speed, density of elements, power dissipation due to parasitic and in the interconnects may provide a performance of the spin torque majority gate logic comparable to CMOS. For example, in an embodiment, a 1-bit cell of a full carry adder is considered. The comparison shows that spin torque logic may be made competitive in terms of both power dissipation and computational throughput. Additional advantages relative to CMOS of may include reconfigurability, non-volatility and radiation hardness.

Thus, spin torque magnetic integrated circuits and devices therefor have been disclosed. In accordance with an embodiment of the present invention, a spin torque magnetic integrated circuit includes a first free ferromagnetic layer disposed above a substrate. A coupling layer is disposed on the first free ferromagnetic layer and a second free ferromagnetic layer is disposed on the coupling layer. A tunnel oxide layer is disposed above the second free ferromagnetic layer. A write pillar and a read pillar are included, each pillar disposed above the tunnel oxide layer and including an anti-ferromagnetic layer disposed above a fixed ferromagnetic layer. In one embodiment, the coupling layer is for stabilizing an alignment of magnetization in the first and second free ferromagnetic layers. In one embodiment, the coupling layer has a thickness of less than approximately 1 nanometer.

What is claimed is:

1. A spin torque magnetic device for a logic circuit, the spin torque magnetic device comprising:
   a majority gate structure;
   an output coupled to the majority gate structure; and
   three inputs coupled to the majority gate structure, wherein the majority gate structure comprises a first free ferromagnetic layer disposed above a substrate, and a tunnel dielectric layer disposed above the first free ferromagnetic layer.

2. The spin torque magnetic device of claim 1, wherein, from a plan view perspective, the majority gate structure is in the form of a cross having four ends.

3. The spin torque magnetic device of claim 2, wherein the output is coupled to a first of the four ends, and wherein the three inputs are coupled to the three remaining ends of the cross, respectively.

4. The spin torque magnetic device of claim 1, wherein the output is configured to be used as an input to another gate structure.

5. The spin torque magnetic device of claim 4, wherein the output is for inputting a magnetization signal into the other gate structure.

6. The spin torque magnetic device of claim 1, wherein the device is a reconfigurable AND/OR gate.

7. The spin torque magnetic device of claim 1, further comprising:
   a sense amplifier coupled to the output, the sense amplifier configured to perform read-out of the output.

8. The spin torque magnetic device of claim 1, further comprising:
   a driver transistor coupled to one of the inputs, the driver transistor for passing current to the input.

9. The spin torque magnetic device of claim 1, wherein the majority gate structure further comprises:
   a coupling layer disposed on the first free ferromagnetic layer;
   a second free ferromagnetic layer disposed on the coupling layer, wherein the tunnel dielectric layer is disposed above the second free ferromagnetic layer.

* * * * *

UNITED STATES PATENT AND TRADEMARK OFFICE
CERTIFICATE OF CORRECTION

| | | |
|---|---|---|
| PATENT NO. | : 8,198,692 B2 | Page 1 of 1 |
| APPLICATION NO. | : 13/279112 | |
| DATED | : June 12, 2012 | |
| INVENTOR(S) | : Nikonov et al. | |

It is certified that error appears in the above-identified patent and that said Letters Patent is hereby corrected as shown below:

In the Specification

In column 9, line 26 delete, "projection m/z" and insert -- projection mz --.

In column 9, line 30 delete, "m/z" and insert -- mz --.

Signed and Sealed this
First Day of April, 2014

Michelle K. Lee
*Deputy Director of the United States Patent and Trademark Office*